(12) United States Patent
Huang et al.

(10) Patent No.: US 11,665,887 B2
(45) Date of Patent: May 30, 2023

(54) SEMICONDUCTOR STRUCTURE HAVING A LANDING AREA EXTENDS FROM FIRST PORTION TO SECOND PORTION OF AN ACTIVE AREA ACROSS A BIT-LINE

(71) Applicant: NANYA TECHNOLOGY CORPORATION, New Taipei (TW)

(72) Inventors: Chih-Wei Huang, Taoyuan (TW); Hsu-Cheng Fan, Taoyuan (TW); Chih-Hao Kuo, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 37 days.

(21) Appl. No.: 17/449,257

(22) Filed: Sep. 28, 2021

(65) Prior Publication Data

US 2023/0114564 A1 Apr. 13, 2023

(51) Int. Cl.
*H01L 27/108* (2006.01)
*H01L 23/532* (2006.01)

(52) U.S. Cl.
CPC .... *H01L 27/10885* (2013.01); *H01L 23/5329* (2013.01); *H01L 27/10823* (2013.01); *H01L 27/10891* (2013.01)

(58) Field of Classification Search
CPC ......... H01L 27/10823; H01L 27/10885; H01L 27/10891
USPC ....................................................... 257/330
See application file for complete search history.

(56) References Cited

U.S. PATENT DOCUMENTS 9,099,343 B2 * 8/2015 Kim .................. H01L 27/10855

* cited by examiner

*Primary Examiner* — Hoai V Pham
(74) *Attorney, Agent, or Firm* — CKC & Partners Co., LLC

(57) ABSTRACT

A semiconductor structure includes a substrate, a bit line, a dielectric layer and a word line. The substrate has an active area and a trench. The bit line is on the substrate and extends along a direction. The active area includes a first portion and a second portion respectively located at two opposite sides of the bit line and spaced apart from each other along the direction. A landing area extends from the first portion of the active area to the second portion of the active area across the bit line. A dielectric layer is in the trench. The active area is surrounded by the dielectric layer. The word line is surrounded by the dielectric layer. The word line is curved and below the bit line. A portion of the word line is between first and second end portions of the landing area.

16 Claims, 4 Drawing Sheets

SEMICONDUCTOR STRUCTURE HAVING A LANDING AREA EXTENDS FROM FIRST PORTION TO SECOND PORTION OF AN ACTIVE AREA ACROSS A BIT-LINE

BACKGROUND

Field of Invention

The present disclosure relates to a semiconductor structure.

Description of Related Art

In general, a semiconductor device is typically packaged with a high density of transistors. The transistors of the semiconductor device may have higher channel lengths to mitigate a short channel effect. However, in order to mitigate the short channel effect, a larger pitch size between the transistors and utilization of a high die area are required. For example, an active area and a cell contact of the semiconductor device may be a landing area for a capacitor of the semiconductor device. Since the semiconductor device is continuously minimized, the landing area of the capacitor becomes smaller as well. Due to the smaller landing area, a resistance of the capacitor may become higher such that a current of the capacitor may decrease. In addition, the capacitor may suffer a risk of contact open, which is disadvantageous to the semiconductor device.

SUMMARY

An aspect of the present disclosure is related to a semiconductor structure.

According to an embodiment of the present disclosure, a semiconductor structure includes a substrate, a bit line, a dielectric layer and a word line. The substrate has an active area and a trench adjacent to the active area. The bit line is on the substrate and extends along a direction. The active area includes a first portion and a second portion respectively located at two opposite sides of the bit line and spaced apart from each other along the direction. A landing area extends from the first portion of the active area to the second portion of the active area across the bit line. A dielectric layer is in the trench. The active area is surrounded by the dielectric layer. The word line is surrounded by the dielectric layer. The word line is curved and below the bit line. A portion of the word line is between first and second end portions of the landing area.

In an embodiment of the present disclosure, the semiconductor structure further includes a hard mask layer. The hard mask covers the bit line. A height of the hard mask layer is greater than a height of the bit line.

In an embodiment of the present disclosure, the semiconductor structure further includes a first insulation layer. The first insulation layer is located on sidewalls of the bit line and the hard mask layer.

In an embodiment of the present disclosure, the semiconductor structure further includes a spacer. The spacer is located on a sidewall of the first insulation layer. The spacer is made of a material that includes silicon oxide.

In an embodiment of the present disclosure, the semiconductor structure further includes a second insulation layer. The second insulation layer is located on a sidewall of the spacer. The first insulation layer and the second insulation layer have a same material.

In an embodiment of the present disclosure, the semiconductor structure further includes a cell contact. The cell contact is located on the dielectric layer. The cell contact extends to a sidewall of the second insulation layer.

In an embodiment of the present disclosure, the cell contact is directly in contact with the active area of the substrate.

In an embodiment of the present disclosure, the semiconductor structure further includes a bit line contact. The bit line contact is below the bit line. The bit line contact and the cell contact have a same material.

In an embodiment of the present disclosure, the bit line contact is directly in contact with the active area of the substrate.

In an embodiment of the present disclosure, the semiconductor structure further includes a first semiconductor layer. The first semiconductor layer is below the bit line.

In an embodiment of the present disclosure, the semiconductor structure further includes a first isolation layer. The first isolation layer is below the first semiconductor layer.

In an embodiment of the present disclosure, the first isolation layer is made of a material that includes nitride.

In an embodiment of the present disclosure, the semiconductor structure further includes a second isolation layer. The second isolation layer is directly in contact with cell contact.

In an embodiment of the present disclosure, the second isolation layer is made of a material that includes nitride.

In an embodiment of the present disclosure, the semiconductor structure further includes a gate dielectric layer and a second semiconductor layer. The gate dielectric layer surrounds the word line. The gate dielectric layer and the second isolation layer are made of different materials. The second semiconductor layer is between the second isolation layer and the gate dielectric layer.

In an embodiment of the present disclosure, the gate dielectric layer is made of a material that includes oxide.

In the aforementioned embodiments of the present disclosure, because the word line of the semiconductor structure is curved, areas of the first end portion and the second end portion of the landing area may increase. Therefore, when the cell contact is formed on the first end portion and the second end portion of the landing area, an area of the cell contact may increase as well. As a result, it may prevent a capacitor from being under a risk of contact open when the capacitor lands on the area of the cell contact. Furthermore, because the area of the cell contact is increased, a resistance may decrease while the capacitor lands on the area of the cell contact, such that a current of the capacitor may increase to improve a performance of the semiconductor structure.

DETAILED DESCRIPTION

Figure 1:
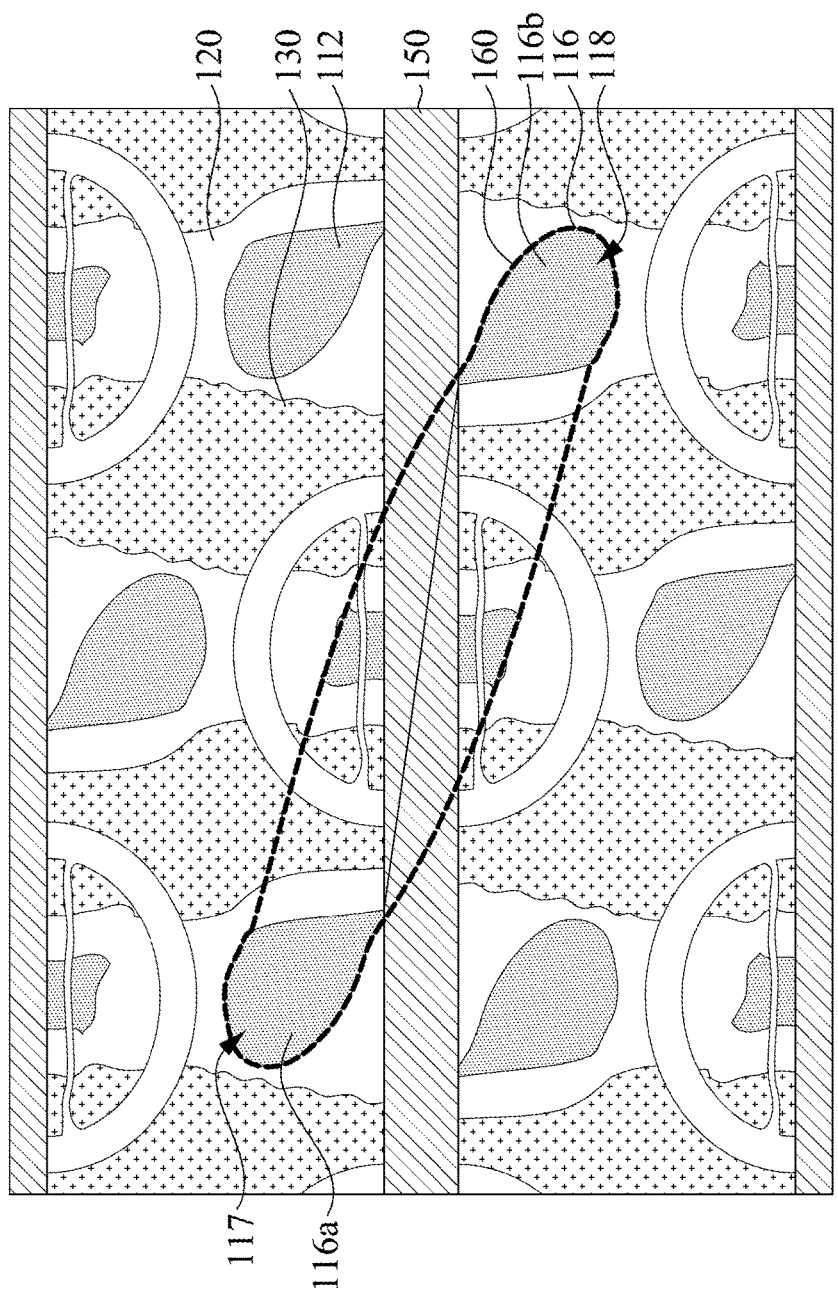
FIG. 1 illustrates a top view of a semiconductor structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
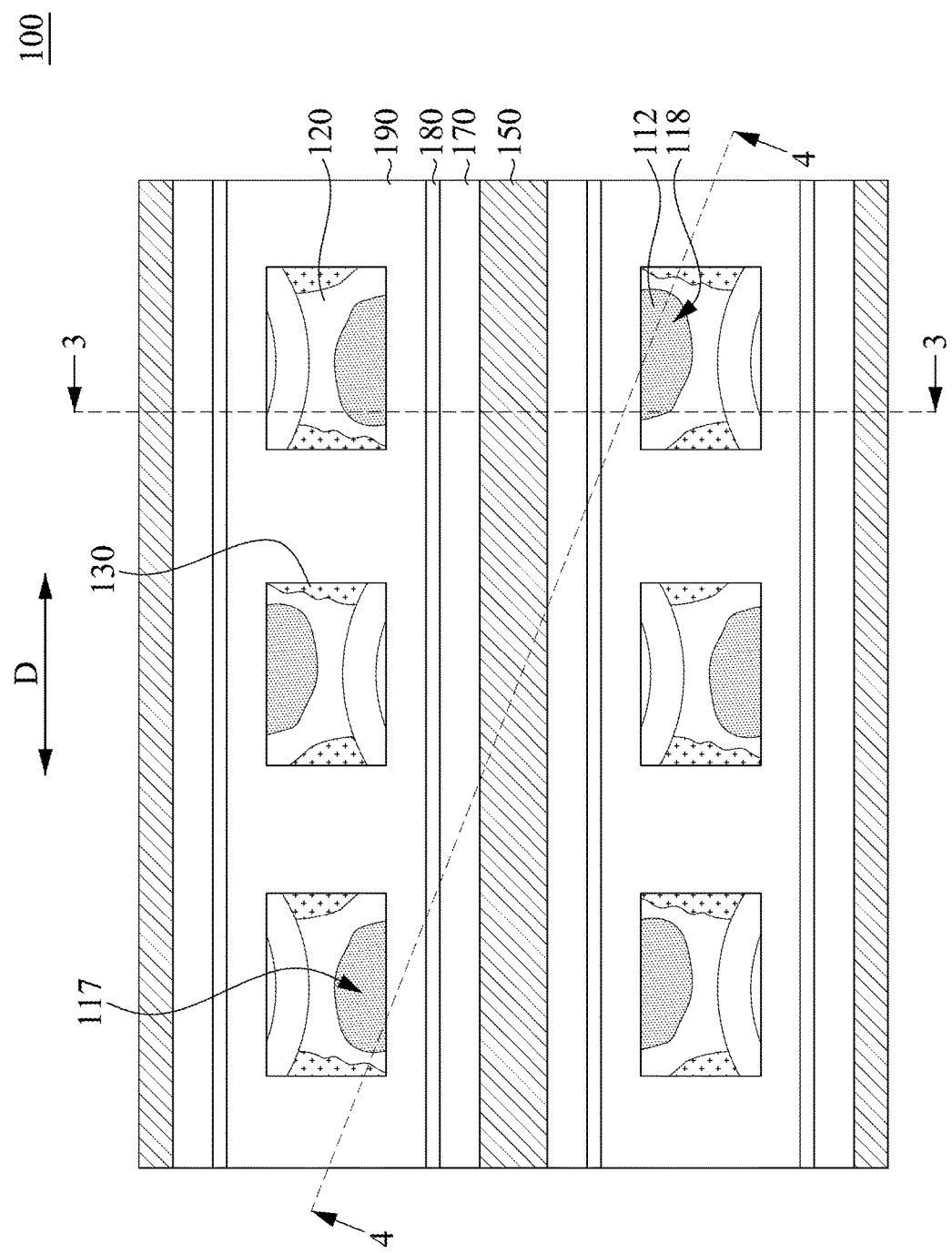
FIG. 2 illustrates a top view of the semiconductor structure of FIG. 1 after a first insulation layer, a spacer and a second insulation layer being formed, in which a cell contact is omitted.
Figure 3:
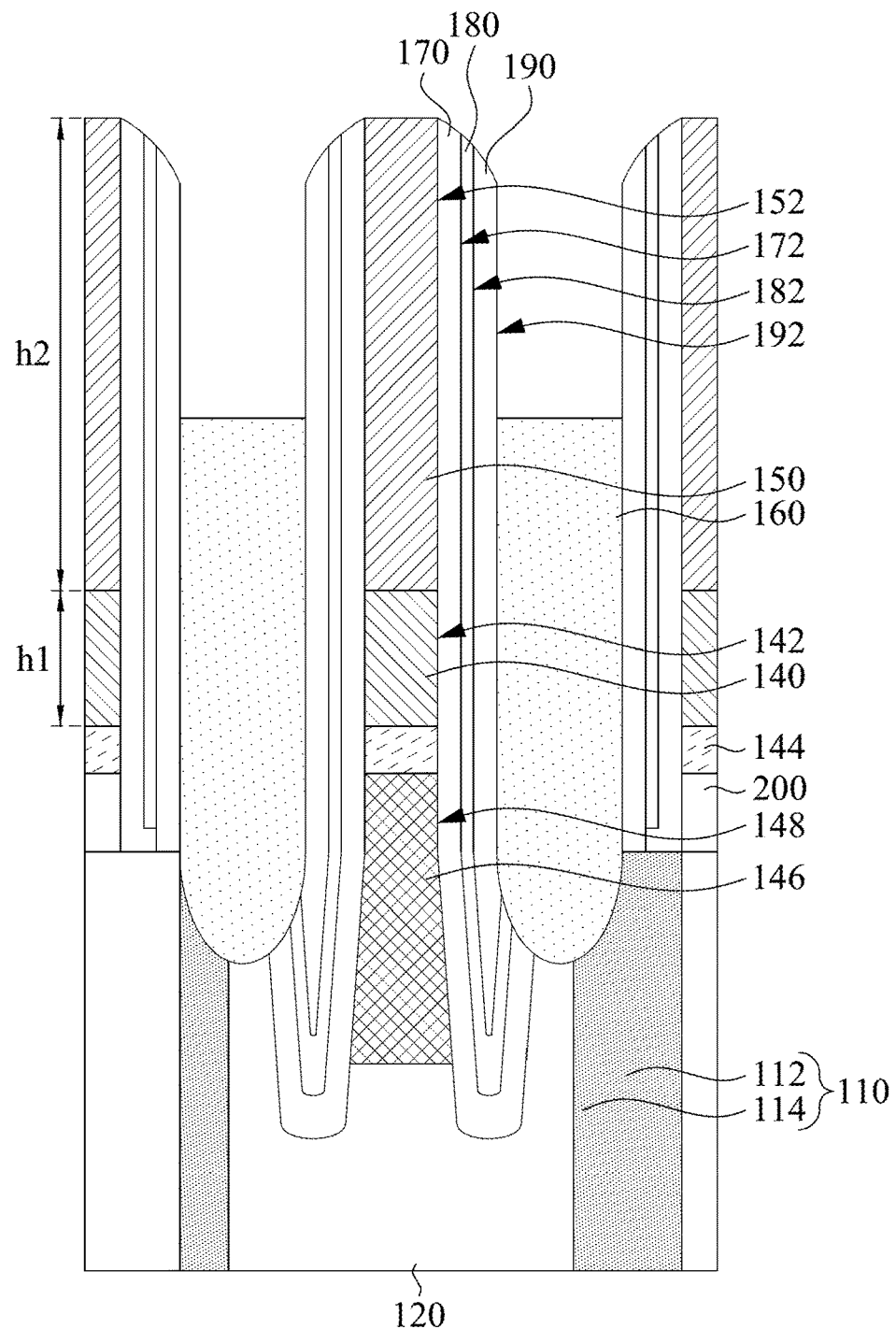
FIG. 3 illustrates a cross-sectional view of the semiconductor structure of FIG. 2 along a line segment 3-3.

FIG. 1 illustrates a top view of a semiconductor structure 100 according to one embodiment of the present disclosure. FIG. 2 illustrates a top view of the semiconductor structure 100 of FIG. 1 after a first insulation layer 170, a spacer 180 and a second insulation layer 190 are formed, in which a cell contact 160 (see FIG. 3) is omitted. FIG. 3 illustrates a cross-sectional view of the semiconductor structure 100 of FIG. 2 along a line segment 3-3. Referring to both FIG. 1 and FIG. 3, the semiconductor structure 100 includes a substrate 110, a dielectric layer 120, a word line 130 and a bit line 140. The substrate 110 may be a bulk semiconductor substrate including a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP).

The substrate 110 has an active area 112 and a trench 114 adjacent to the active area 112. In some embodiment, a bulk semiconductor substrate may be patterned to form the substrate 110 with the active area 112 and the trench 114. The dielectric layer 120 is in the trench 114 of the substrate 110. For example, the dielectric layer 120 may be made of a material that includes silicon oxide, silicon nitride, silicon oxy-nitride, a low-k dielectric material (e.g., with k-value less than about 3.9), and/or other suitable dielectric materials. In some embodiments, the dielectric layer 120 is a spin-on dielectric (SOD) layer. In other words, the dielectric layer 120 may be formed by spin coating. In alternative embodiments, the dielectric layer 120 may be formed by chemical vapor deposition (CVD), physical vapor deposition (PVD), or any other suitable method.

The bit line 140 is on the substrate 110 and extends along a direction D. The active area 112 of the substrate 110 includes a first portion 117 and a second portion 118 respectively located at two opposite sides of the bit line 140 and spaced apart from each other along the direction D. A landing area 116 extends from the first portion 117 of the active area 112 to the second portion 118 of the active area 112 across the bit line 140. The landing area 116 may be an island shape, but it is not limited in this regard. The active area 112 of the substrate 110 is surrounded by the dielectric layer 120, and the word line 130 is surrounded by the dielectric layer 120. The word line 130 is curved and below the bit line 140. A portion of the word line 130 is between a first end portion 116a and a second end portion 116b of the landing area 116. The word line 130 may be made of a conductive material, such as polysilicon, aluminum (Al), copper (Cu), titanium (Ti), tantalum (Ta), tungsten (W), cobalt (Co), tantalum nitride (TaN), TiN, WN, TiAl, TiAlN, TaCN, TaC, TaSiN, other suitable materials, and/or combinations thereof.

Furthermore, because the word line 130 is cured, areas of the first end portion 116a and the second end portion 116b of the landing area 116 may increase. For example, the areas of the first end portion 116a and the second end portion 116b of the landing area 116 may increase from 474 nm$^2$ to 504 nm$^2$. In some embodiments, the semiconductor structure 100 further includes a hard mask layer 150 and the cell contact 160. The hard mask layer 150 covers the bit line 140, and a height h2 of the hard mask layer 150 is greater than a height h1 of the bit line 140. The cell contact 160 is located on the active area 112 of the substrate 110 and the dielectric layer 120.

Particularly, because the word line 130 of the semiconductor structure 100 is curved, the areas of the first end portion 116a and the second end portion 116b of the landing area 116 may increase. Therefore, when the cell contact 160 is formed on the first end portion 116a and the second end portion 116b of the landing area 116, an area of the cell contact 160 may increase as well. As a result, it may prevent a capacitor from being under a risk of contact open when the capacitor lands on the area of the cell contact 160. Furthermore, because the area of the cell contact 160 is increased, a resistance may decrease while the capacitor lands on the area of the cell contact 160, such that a current of the capacitor may increase to improve a performance of the semiconductor structure 100.

In some embodiments, the semiconductor structure 100 further includes a first semiconductor layer 144 and a first isolation layer 200. The first semiconductor layer 144 is below the bit line 140, and the first semiconductor layer 144 may be made of a material that includes polysilicon. The first isolation layer 200 is below the first semiconductor layer 144, and the first isolation layer 200 may be made of a material that includes nitride.

Referring to both FIG. 2 and FIG. 3, the semiconductor structure 100 further includes the first insulation layer 170, the spacer 180 and the second insulation layer 190. The first insulation layer 170 is located on a sidewall 142 of the bit line 140 and a sidewall 152 of the hard mask layer 150. The spacer 180 is located between the first insulation layer 170 and the second insulation layer 190 and located on a sidewall 172 of the first insulation layer 170. Furthermore, the spacer 180 is made of a material that includes silicon oxide. The second insulation layer 190 is located on a sidewall 182 of the spacer 180. The first insulation layer 170 and the second insulation layer 190 may have a same material. For example, the first insulation layer 170 and the second insulation layer 190 may be made of an insulation material that includes silicon oxide, silicon oxy-nitride, silicon nitride, SiOC, SiCN or SiOCN. The first insulation layer 170 and the second insulation layer 190 may be formed by low pressure chemical vapor deposition (LPCVD), plasma-CVD, ALD or any other suitable method. In addition, the cell contact 160 is directly in contact with the active area 112 of the substrate 110 and extends to a sidewall 192 of the second insulation layer 190. The spacer 180 will be removed to become an air gap (not shown) between the first insulation layer 170 and the second insulation layer 190.

Figure 4:
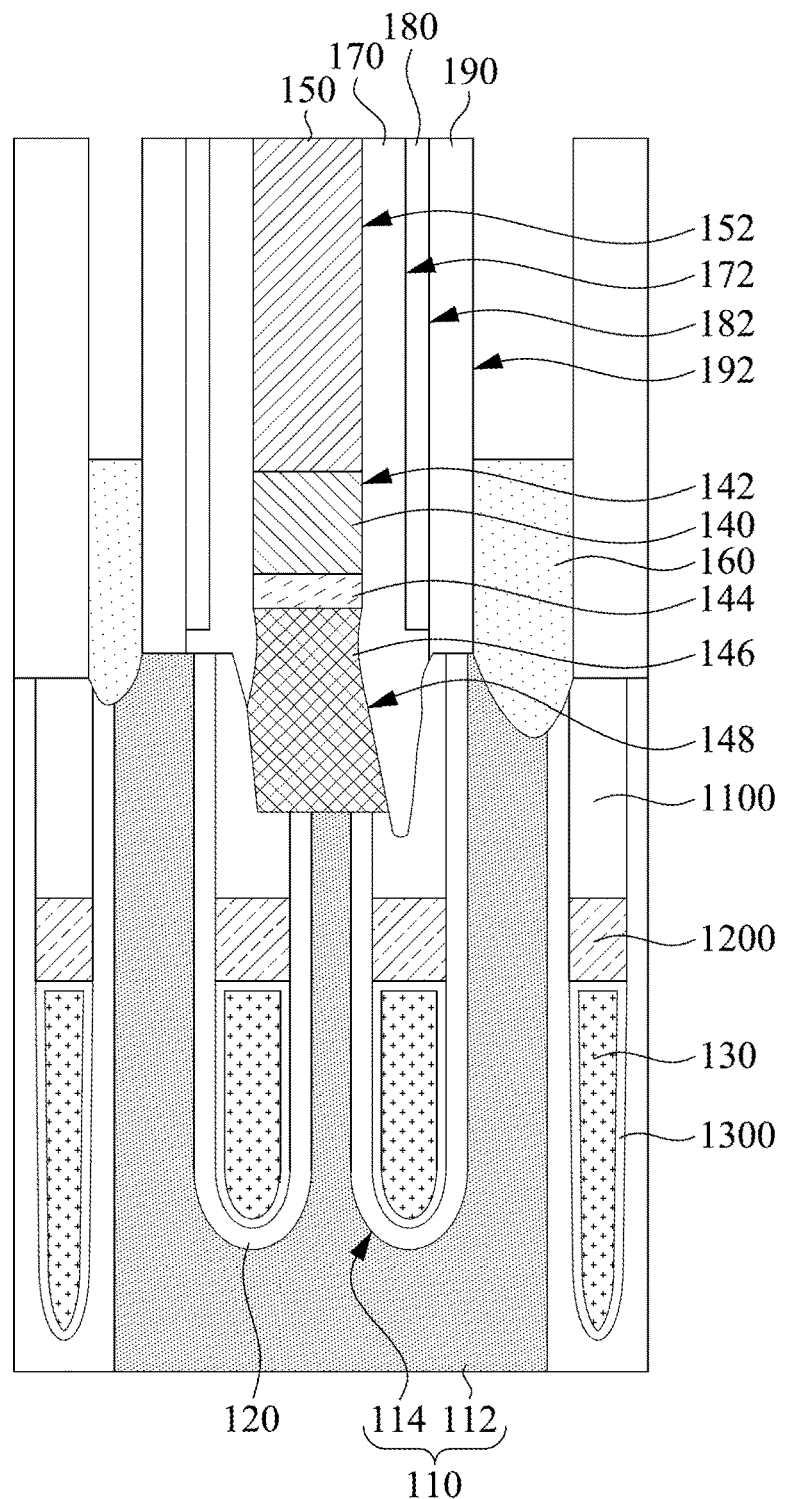
FIG. 4 illustrates a cross-sectional view of the semiconductor structure of FIG. 2 along a line segment 4-4.

FIG. 4 illustrates a cross-sectional view of the semiconductor structure 100 of FIG. 2 along a line segment 4-4. Referring to FIG. 3 and FIG. 4, the semiconductor structure further 100 includes a bit line contact 146. The bit line contact 146 is below the bit line 140, and the bit line contact 146 is directly in contact with the active area 112 of the substrate 110. The bit line contact 146 and the cell contact 160 may have a same material. For example, the bit line contact 146 and the cell contact 160 may be made of a material that includes polysilicon. The first insulation layer 170 extends to a sidewall 148 of the bit line contact 146. In addition, the semiconductor structure 100 further includes a second isolation layer 1100, a second semiconductor layer 1200 and a gate dielectric layer 1300. The second isolation layer 1100 is in contact with the cell contact 160. The second semiconductor layer 1200 is located between the second isolation layer 1100 and the gate dielectric layer 1300. The second semiconductor layer 1200 may be made of a material that includes polysilicon. The gate dielectric layer 1300 surrounds the word line 130. The gate dielectric layer 1300 and the second isolation layer 1100 are made of different materials. For example, the gate dielectric layer 1300 may be made of a material that includes oxide, and the second isolation layer 1100 may be made of a material that includes nitride.

In summary, because the word line of the semiconductor structure is curved, areas of the first end portion and the second end portion of the landing area may increase. Therefore, when the cell contact is formed on the first end portion and the second end portion of the landing area, an area of the cell contact may increase as well. As a result, it may prevent a capacitor from being under a risk of contact open when the capacitor lands on the area of the cell contact. Furthermore, because the area of the cell contact is increased, a resistance may decrease while the capacitor lands on the area of the cell contact, such that a current of the capacitor may increase to improve a performance of the semiconductor structure.

Although the present disclosure has been described in considerable detail with reference to certain embodiments thereof, other embodiments are possible. Therefore, the spirit and scope of the appended claims should not be limited to the description of the embodiments contained herein. In view of the foregoing, it is intended that the present disclosure covers modifications and variations of this disclosure provided they fall within the scope of the following claims.

What is claimed is:

1. A semiconductor structure, comprising:
    a substrate having an active area and a trench adjacent to the active area;
    a bit line located on the substrate and extending along a direction, wherein the active area comprises a first portion and a second portion respectively located at two opposite sides of the bit line and spaced apart from each other along the direction, and a landing area extends from the first portion of the active area to the second portion of the active area across the bit line;
    a dielectric layer located in the trench, wherein the active area is surrounded by the dielectric layer; and
    a word line surrounded by the dielectric layer, wherein the word line is curved and below the bit line, and a portion of the word line is located between first and second end portions of the landing area.

2. The semiconductor structure of claim 1, further comprising:
    a hard mask layer covering the bit line, wherein a height of the hard mask layer is greater than a height of the bit line.

3. The semiconductor structure of claim 2, further comprising:
    a first insulation layer located on sidewalls of the bit line and the hard mask layer.

4. The semiconductor structure of claim 3, further comprising:
    a spacer located on a sidewall of the first insulation layer, wherein the spacer is made of a material that comprises silicon oxide.

5. The semiconductor structure of claim 4, further comprising:
    a second insulation layer located on a sidewall of the spacer, wherein the first insulation layer and the second insulation layer have a same material.

6. The semiconductor structure of claim 5, further comprising:
    a cell contact located on the dielectric layer, wherein the cell contact extends to a sidewall of the second insulation layer.

7. The semiconductor structure of claim 6, wherein the cell contact is directly in contact with the active area of the substrate.

8. The semiconductor structure of claim 6, further comprising:
    a bit line contact below the bit line, wherein the bit line contact and the cell contact have a same material.

9. The semiconductor structure of claim 8, wherein the bit line contact is directly in contact with the active area of the substrate.

10. The semiconductor structure of claim 6, further comprising:
    a second isolation layer being directly in contact with cell contact.

11. The semiconductor structure of claim 10, wherein the second isolation layer is made of a material that comprises nitride.

12. The semiconductor structure of claim 10, further comprising:
    a gate dielectric layer surrounding the word line, wherein the gate dielectric layer and the second isolation layer are made of different materials; and
    a second semiconductor layer located between the second isolation layer and the gate dielectric layer.

13. The semiconductor structure of claim 12, wherein the gate dielectric layer is made of a material that comprises oxide.

14. The semiconductor structure of claim 1, further comprising:
    a first semiconductor layer below the bit line.

15. The semiconductor structure of claim 14, further comprising:
    a first isolation layer below the first semiconductor layer.

16. The semiconductor structure of claim 15, wherein the first isolation layer is made of a material that comprises nitride.

* * * * *